United States Patent [19]
Geisler

[11] Patent Number: 5,691,655
[45] Date of Patent: Nov. 25, 1997

[54] BUS DRIVER CIRCUIT CONFIGURED TO PARTIALLY DISCHARGE A BUS CONDUCTOR TO DECREASE LINE TO LINE COUPLING CAPACITANCE

[75] Inventor: Joseph P. Geisler, Austin, Tex.

[73] Assignee: Advanced Micro Devices, Inc., Sunnyvale, Calif.

[21] Appl. No.: 562,682

[22] Filed: Nov. 27, 1995

[51] Int. Cl.$^6$ ............................................. H03K 17/16
[52] U.S. Cl. .......................... 326/86; 326/27; 326/58
[58] Field of Search ........................... 326/21, 27, 56, 326/58, 86, 97

[56] References Cited

U.S. PATENT DOCUMENTS

| | | | |
|---|---|---|---|
| 4,488,066 | 12/1984 | Shoji | 326/56 |
| 5,105,104 | 4/1992 | Eisele et al. | 326/86 |
| 5,151,621 | 9/1992 | Goto | 326/58 |
| 5,189,319 | 2/1993 | Fung et al. | 326/86 |
| 5,289,424 | 2/1994 | Ito et al. | 365/189.11 |
| 5,297,104 | 3/1994 | Nakashima | 365/230.06 |
| 5,555,513 | 9/1996 | Harrington et al. | 364/602 |

FOREIGN PATENT DOCUMENTS

| | | |
|---|---|---|
| 0 681 370 A1 | 11/1995 | European Pat. Off. . |
| 2 614 743 | 11/1988 | France . |

OTHER PUBLICATIONS

Patent Abstracts of Japan, vol. 014, No. 336, (E-0953), Jul. 19, 1990 & JP 02 113721 A, (Mitsubishi) Apr. 25, 1990.
International Search Report of PCT/US 96/16462 dated Feb. 7, 1997.

*Primary Examiner*—Edward P. Westin
*Assistant Examiner*—Benjamin D. Driscoll
*Attorney, Agent, or Firm*—Kevin L. Daffer; Conley, Rose & Tayon

[57] ABSTRACT

A driver circuit is provided which unconditionally discharges a bus conductor during clock cycles in which the driver circuit is transmitting a value. The unconditional discharge occurs during a first drive phase of the logic drive state. During a second drive phase, the driver circuit either charges or continues to discharge the conductor based on the data value being transmitted. Since the conductors are transitioning in the same direction at approximately the same rate, line to line coupling is virtually non-existent during the first drive phase. By partially discharging bus conductors during the first drive phase, transition speed is increased to the point at which a receiving circuit senses the transmitted value. Effectively, the line-to-line coupling which would have occurred during the first drive phase is endured during the second drive phase, when certain conductors may be recharged. Shifting the coupling to the second drive phase results in the more rapid transition of the bus signals during the first drive phase.

20 Claims, 7 Drawing Sheets

5,691,655

BUS DRIVER CIRCUIT CONFIGURED TO PARTIALLY DISCHARGE A BUS CONDUCTOR TO DECREASE LINE TO LINE COUPLING CAPACITANCE

BACKGROUND OF THE INVENTION

1. Field of the Invention

This invention relates to a multi-conductor bus and more particularly to a plurality of driver circuits which partially discharge the multi-conductor bus during a first portion of a drive phase, and subsequently charge those conductors conveying a high (i.e. VDD) voltage and discharge those conductors conveying a low (i.e. ground) voltage during a second portion of a drive phase.

2. Description of the Relevant Art

A bus is generally defined as a set of interconnect lines (or conductors) which serve to electrically connect two or more components within a system. A collection of voltage levels are forwarded across the bus to allow proper operation of the components. For example, a microprocessor is connected to memories and input/output devices by certain bus structures. There are numerous types of buses which are classified according to their operation. Examples of well known types of buses include address buses, data buses and control buses.

Conductors within a bus generally extend parallel to each other across a semiconductor topography. The conductors are isolated from each other and from underlying conductive elements by a dielectric, a suitable dielectric being, for example, silicon dioxide. FIG. 1 illustrates, in cross section, a series of conductors 10 dielectrically spaced over a semiconductor substrate 12. Conductors 10 are made from a conductive material, a suitable material includes Al, Ti, Ta, W, Mo, polysilicon, or a combination thereof. Substrate 12 includes any type of material which can retain dopant ions and the isolated conductivity regions brought about by those ions. Typically, substrate 12 is a silicon-based material which receives p-type or n-type ions. A channel region interposed between p-type source and drain regions comprise a PMOS device, while a channel region between n-type source and drain regions comprise an NMOS device.

The partial cross-section shown in FIG. 1 indicates a dielectric thickness $T_d$ between conductors 10 and substrate 12. As follows, thickness $T_d$ is partially determinative of the conductor-to-substrate capacitance $C_{LS}$.

$$C_{LS} = eW_LL/T_d \qquad \text{(Eq. 1)}$$

where e is the permittivity of the dielectric material, $W_L$ is the conductor width, and L is the conductor length. Resistance of the conductor is calculated as follows:

$$R = (rL)/W_LT_I \qquad \text{(Eq. 2)}$$

where r represents resistivity of the conductor material, and $T_I$ is the interconnect thickness. A product of equations 1 and 2 indicates the propagation delay of conductor 10 as follows:

$$RC_{LS} = reL^2/T_IT_d$$

Propagation delay is an important characteristic of an integrated circuit since it limits the speed (frequency) at which the circuit or circuits can operate. The shorter the propagation delay, the higher the speed of the circuit or circuits. It is therefore important that propagation delay be minimized as much as possible given the geometric constraints of the semiconductor topography.

Propagation delay is not merely a function of the line-substrate capacitance. RC delay can also be attributed to the capacitance between conductors 10. Accordingly, propagation delay is determined by parasitic capacitance values between conductors ($C_{LL}$), and the parasitic capacitance values between each conductor and substrate ($C_{LS}$). As circuit density increases, spacing ($W_S$) between conductors 10 decrease and capacitance $C_{LL}$ becomes predominant relative to $C_{LS}$. In other words, line-to-line capacitance $C_{LL}$ increases with decreasing spacing $W_S$ between conductors 10. FIG. 2 illustrates the effect of $W_S$ on $C_{LL}$. As $W_S$ decreases, $C_{LL}$ is shown to increase dramatically as compared to $C_{LS}$. Modern integrated circuits employing fine interconnect spacing thereby define $C_{LL}$ as the primary parasitic capacitance rather than $C_{LS}$.

Increases in $C_{LL}$ pose two major problems. First, an increase in $C_{LL}$ generally causes an increase in the time at which a transition on the one end of the conductor occurs at the other end. Increase in transition time (i.e., increase in speed degradation) thereby requires a longer drive period. If the conductor is a critical path, speed degradation on that line will jeopardize functionality of the overall circuit. Second, a larger $C_{LL}$ causes an increase in crosstalk noise. A conductor which does not transition, nonetheless receives crosstalk noise from neighboring lines which do.

Speed degradation poses problems primarily during times when a target line transitions opposite the transition of neighboring lines. Speed degradation occurs primarily in statically driven bus conductors. As defined herein, a static bus is one having one or more conductors which can transition from one rail to the other or vice versa. Crosstalk noise, however, poses problems primarily during times when the target line does not transition and the neighboring lines do. Crosstalk is particularly severe in bus conductors which are dynamically driven. As defined herein, a dynamic bus is one having one or more conductors which are precharged during one phase of a clock signal, and driven to a desired logic level during another phase of that clock signal. A dynamic bus thereby requires two separate drive states, a precharge drive state and a logic drive state. The precharge state, arising from a precharge driver, forces each conductor to a precharged value of either VDD or ground. If the dynamic bus utilizes a logic high precharge (i.e., conductors precharged to VDD), it is said to be VDD precharged. Depending upon the application, a dynamic bus can, for example, be precharged to ground. Subsequent to precharge, a logic driver circuit causes the precharged line to either maintain its precharged value or be driven to the opposing rail. If, for example, a line is VDD-precharged, it can thereafter be conditionally discharged during the logic drive state if the desired logic value is zero. Conversely, if the desired logic value is logic high or "1", then the precharged line will not be discharged during the subsequent logic drive state.

FIG. 4 illustrates one of a plurality of conductors 10 within a dynamic bus structure 14. Conductor 10 is precharged by precharge driver 16 during phase 1 (ph1) of a clocking signal, or specifically, a logic inverse of phase 1 clock (i.e., xph1). During subsequent phase 2 (ph2) of the clocking signal, an x logic input is driven onto conductor 10 by logic driver 18. For example, if conductor 10 is precharged to VDD, then a high logic input x can cause discharge of conductor 10 during ph2.

An important advantage in using a dynamic bus, such as that shown by reference 14 is that logic driver 18 causes transition only in one direction. More specifically, a VDD-precharged conductor 10 can only be conditionally discharged to ground by logic driver 18. Since conductors 10 of dynamic bus 14 can only conditionally transition in one direction during the logic drive state, charge transferal or capacitive coupling between neighboring conductors 10 is roughly one half that of a static bus. Capacitive coupling therefore has less of an effect on speed degradation for a dynamic bus than it has for a static bus. Speed degradation and crosstalk noise are a function of line-to-line capacitive coupling. If charge transfers quickly from one line to a neighboring line, then several problems can occur in a dynamic bus structure. For example a VDD-precharged line may source charge to neighboring lines which transition to ground during a subsequent logic drive state. The precharged line may lose enough voltage to cause a receiving circuit to transition to an undesired state. Crosstalk noise from transitioning neighboring lines can therefore deleteriously effect the proper precharged value of the target line interposed between the neighboring lines.

In addition to, or in lieu of, dynamic buses, many circuit designs employ a static bus. Instead of precharging a conductor to VDD or ground during a precharge state followed by a logic drive state, a static bus simply drives the conductor to the desired logic value without requiring a precharged state. A static bus 20 having a plurality of conductors 10 as shown in FIG. 3. Whenever a logic high value is to be driven on conductor 10, PMOS device 22 transitions on while NMOS device 24 transitions off. Conversely, if a logic low value is to be driven on conductor 10, PMOS device 22 is off while NMOS device 24 is on.

Dynamic bus 14 increases speed due simply to its operation. More specifically, a worse case scenario dictates that conductors neighboring a target conductor do not transition against (i.e. in the opposite direction of) the transitioning of the target conductor. For example, neighboring conductors in a dynamic bus do not transition to VDD during times when a target conductor transitions to ground. Conversely, neighboring conductors often do transition against the target conductor in a static bus. Transitioning neighboring conductors against a transitioning target conductor causes capacitive coupling problems attributable to speed degradation problems and noise crosstalk problems.

While dynamic buses have several advantages over static buses, there are instances where further improvements to conventional dynamic buses are necessary. For example, it would be desirable to further increase the speed of a dynamic bus. The improved dynamic bus would diminish the effects of capacitive coupling between neighboring lines until the receiving devices sense the transmitted logic levels upon the bus.

SUMMARY OF THE INVENTION

The problems outlined above are in large part solved by a driver circuit in accordance with the present invention. The present driver circuit unconditionally discharges a bus conductor during clock cycles in which the driver circuit is transmitting a value. The unconditional discharge occurs during a first drive phase of the logic drive state. During a second drive phase, the driver circuit either charges or continues to discharge the conductor based on the data value being transmitted. Since the conductors are transitioning in the same direction at approximately the same rate, line to line coupling is virtually non-existent during the first drive phase. Propagation delay is significantly shorter than that previously achievable using conventional driver circuits. An integrated circuit employing the present driver circuits may be capable of higher operating frequencies, and hence higher performance.

By partially discharging bus conductors during the first drive phase, transition speed is increased to the point at which a receiving circuit senses the transmitted value. Because some bus conductors may be recharged during the second drive phase, the remainder of the transition may proceed at a slower rate. However, the receiving circuit has already sensed the transmitted value. The remainder of the transition may therefore occur at the slower rate without deleteriously affecting the propagation delay of the bus. Effectively, the line-to-line coupling which would have occurred during the first drive phase is endured during the second drive phase, when certain conductors may be recharged. Shifting the coupling to the second drive phase results in the more rapid transition of the bus signals during the first drive phase.

Broadly speaking, the present invention contemplates a driver circuit comprising a first transistor, a second transistor, a first logic circuit, and a second logic circuit. The first transistor is coupled between a ground and a conductor; while the second transistor is coupled between a power supply and the conductor. Coupled to the gate terminal of the first transistor, the first logic receives a first signal indicative of activation of the first transistor. If the first signal is asserted, the first logic circuit is configured to activate the first transistor during a first drive phase of a logic drive state. The second logic circuit is similarly coupled to the gate terminal of the second transistor. The second logic circuit receives a second signal, and is configured to activate the second transistor during a second drive phase of the logic drive state if the second signal is deasserted.

The present invention further contemplates a bus comprising a plurality of conductors and a plurality of driver circuits. Comprising first and second transistor and logic circuits, each of the plurality of driver circuits is coupled to a respective one of the plurality of conductors. The first transistor and logic circuit is configured to discharge the conductor during a first drive phase of a logic drive state. Conversely, the second transistor and logic circuit is configured to selectably charge the conductor during a second drive phase of the logic drive state.

The present invention still further contemplates a method for operating a bus to reduce line to line coupling comprising several steps. First, each of a plurality of conductors configured into the bus is preset to an initial value during a first drive state. Each of the plurality of conductors is driven toward a second value different from the initial value during a first drive phase of a logic drive state. Subsequently, a first portion of the plurality of conductors is driven to the initial value during a second drive phase of the logic drive state; and a second portion of the plurality of conductors is driven to the second value.

BRIEF DESCRIPTION OF THE DRAWINGS

Other objects and advantages of the invention will become apparent upon reading the following detailed description and upon reference to the accompanying drawings in which.

Figure 1:
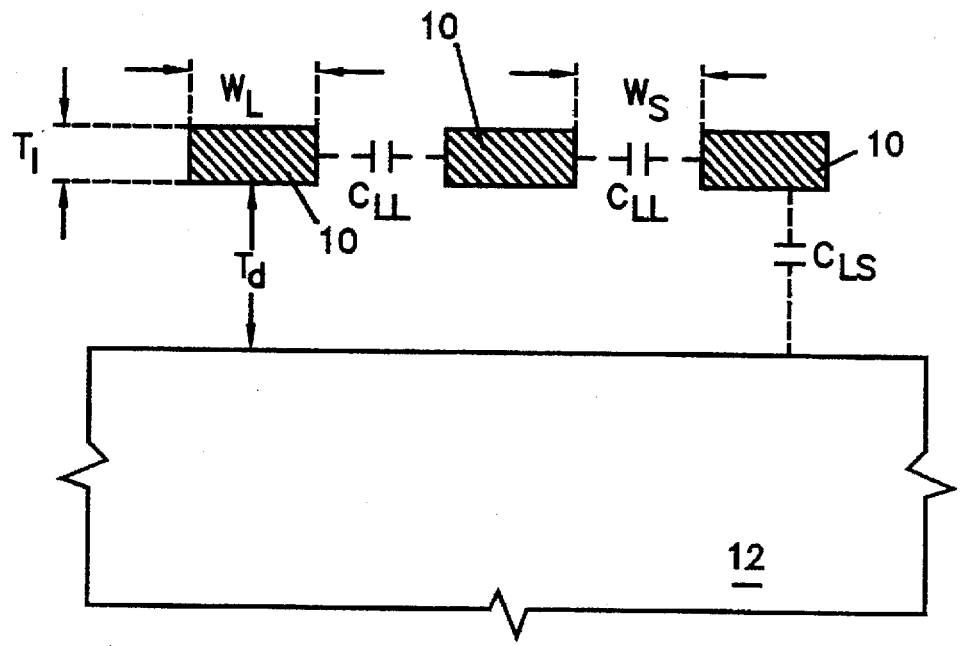
FIG. 1 is a partial cross-sectional view of an integrated circuit topography with conductors dielectrically spaced apart and above a semiconductor substrate.
Figure 2:
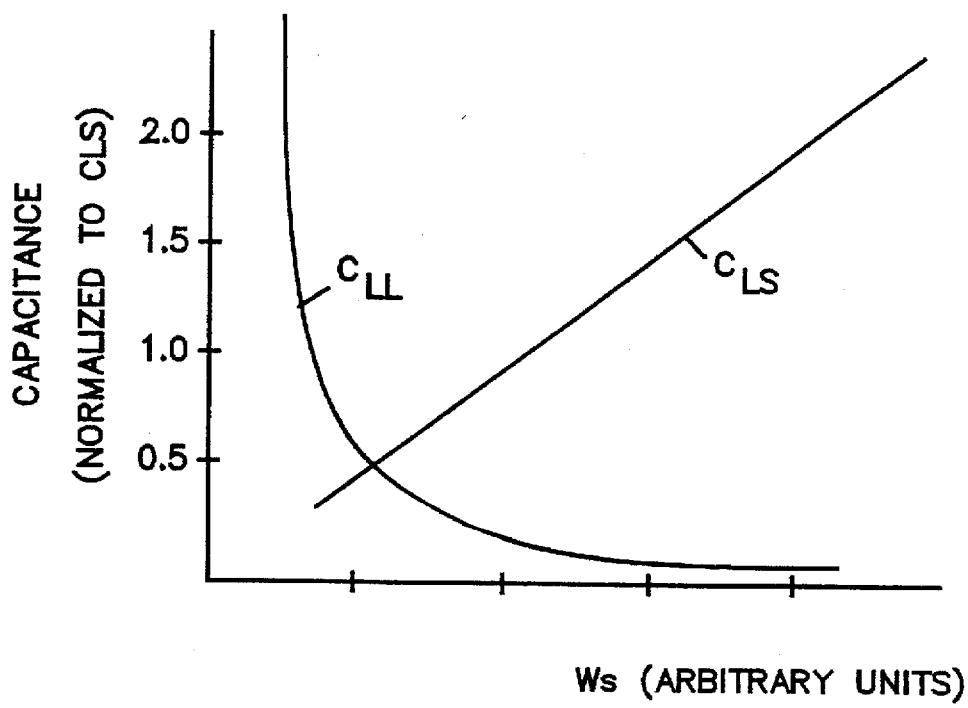
FIG. 2 is a graph of conductor-to-conductor as well as conductor-to-substrate capacitance plotted as a function of line spacing.
Figure 3:
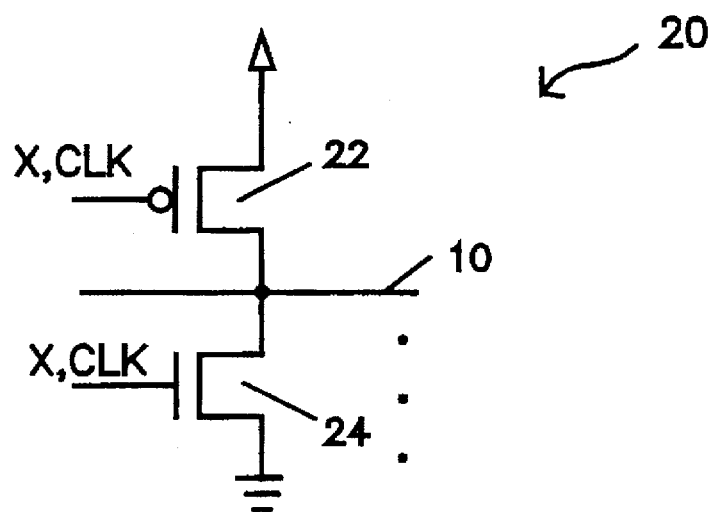
FIG. 3 is an exemplary circuit diagram of one conductor within a statically driven bus.
Figure 4:
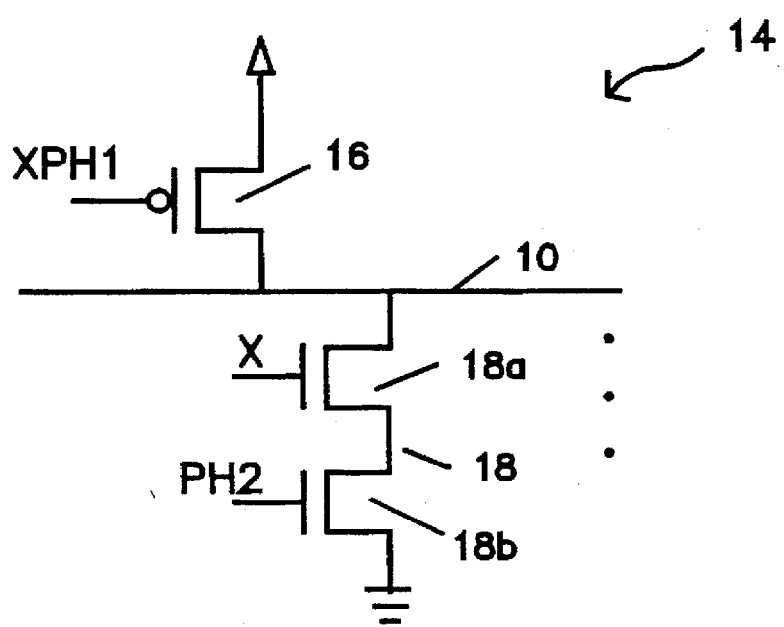
FIG. 4 is an exemplary circuit diagram of one conductor within a dynamically driven bus.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 5:
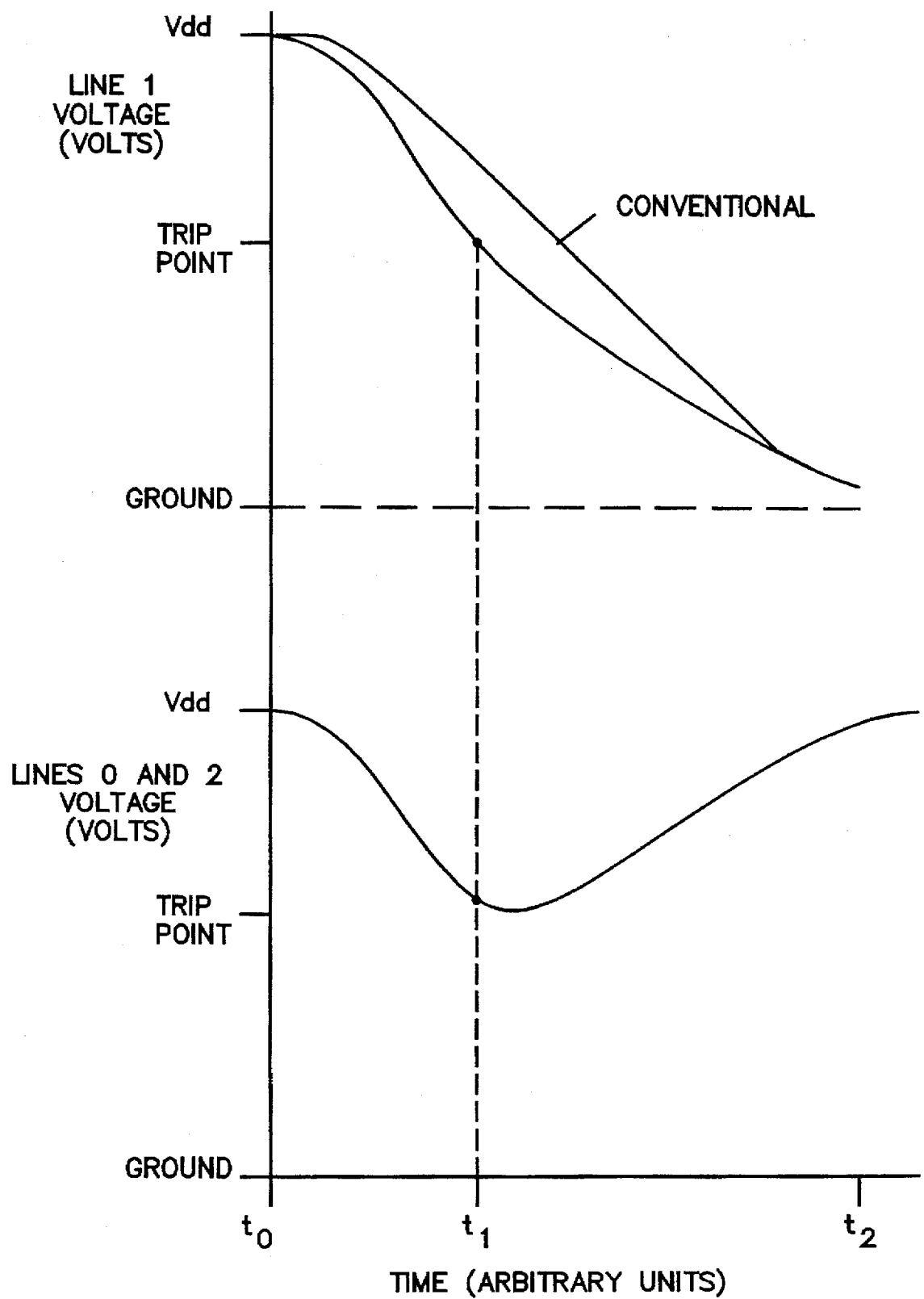
FIG. 5 is a timing diagram showing voltage transitions upon three conductors of a bus in accordance with the present invention.

Turning now to FIG. 5, a timing diagram is shown illustrating waveforms for three neighboring conductors of a dynamic bus. The timing diagram depicts the voltages upon the conductors during a logic drive phase. The conductors are referred to on the diagram as lines 0, 1, and 2, with line 1 being physically configured between lines 0 and 2 upon a semiconductor substrate. The timing diagram illustrates advantages of the present invention for the worst case capacitive coupling upon a dynamic bus: line 1 transitioning low while lines 0 and 2 remain high. With conventional dynamic buses, capacitive coupling occurs between line 0 and line 1 and between line 2 and line 1. As line 1 is discharged, charge transfers occur from both lines 0 and 2 to line 1. The discharge rate of line 1 is slowed due to this charge transfer. The waveform labeled "conventional" upon FIG. 5 shows a typical conventional dynamic bus transition.

Dynamic bus conductors being discharged during a clock cycle are typically discharged to the ground voltage. However, the most important portion of the transition from a high voltage to a low voltage is the portion in which the voltage is greater than the trip point of the receiving circuit. As used herein, the term "trip point" refers to the voltage level applied to the input of the receiving circuit which causes the receiving circuit to respond to the value that is being conveyed upon the bus conductor. For example, when an input voltage to an inverter falls below the trip point, the output of the inverter switches to a logical one (or Vdd). Conversely, when the input voltage to an inverter rises above the trip point, the inverter switches to a logical zero (or ground). Typically, there is a relatively small range of voltages about the trip point for which the output of the receiving circuit is not fully switched in either direction. More particularly, the trip point is often defined as the input voltage at which the output voltage of the receiving circuit is Vdd/2. For balanced CMOS gates (in which the transition from high to low and the transition from low to high occur in approximately equal time intervals), the trip point is approximately Vdd/2. The trip point may be located at other voltages by varying the relative sizes of the NMOS and PMOS devices forming the CMOS gate.

Because the receiving circuit essentially receives the value conveyed upon a bus conductor when the voltage upon that conductor crosses the trip point, the most important portion of the voltage transition upon the bus conductor is the portion prior to the voltage crossing the trip point. The propagation delay of the bus may be measured as the amount of time required from the time that a driver upon a bus conductor begins discharging a bus conductor and the time at which the receiving circuit transitions in response to the discharge. Therefore, speeding the transition to the trip point decreases the propagation delay of the bus.

In order to speed the transition of line 1 to the trip point of the receiver, lines 0 and 2 are partially discharged during the logic drive phase of the driver. During the time period between $t_0$ and $t_1$, lines 0, 1, and 2 are discharging at approximately the same rate. Because the rate of change of the voltage between the lines is substantially zero, capacitive coupling is essentially non-existent. Therefore, the transition occurs at a faster rate than that achievable utilizing a conventional dynamic bus. When the voltage of the lines reaches the trip point (at a time $t_1$ on FIG. 5), lines 0 and 2 begin charging. Since lines 0 and 2 are switching in the opposite direction of line 1, capacitive coupling between lines 0, 1, and 2 becomes large during the time period between $t_1$ and $t_2$. The rate at which line 1 discharges (and at which lines 0 and 2 charge) is slower than the rate of discharge during the time period between $t_0$ and $t_1$. However, since the lines are each transitioning upon the appropriate side of the trip point for the value being conveyed, the receiving circuits have already switched in response to the values. Propagation delay has been advantageously reduced with respect to conventional dynamic buses. Higher frequencies of operation may be achievable within an integrated circuit employing the bus described herein, thereby increasing performance.

The logic drive state is divided into two drive phases as shown in FIG. 5. The first drive phase (between $t_0$ and $t_1$) corresponds to the time interval when each of the bus conductors is unconditionally discharged. The second drive phase (between $t_1$ and $t_2$) corresponds to the time interval when the bus conductors which are not transitioning during the current cycle are recharged and the bus conductors which are transitioning during the current cycle continue to discharge.

As used herein, the term "high voltage" will be used to refer to a voltage substantially equal to the power supply voltage (e.g., between 3.0 to 5.0 volts) supplied to driver circuit 30. Similarly, the term "low voltage" will be used to refer to a voltage substantially equal to ground.

Figure 6:
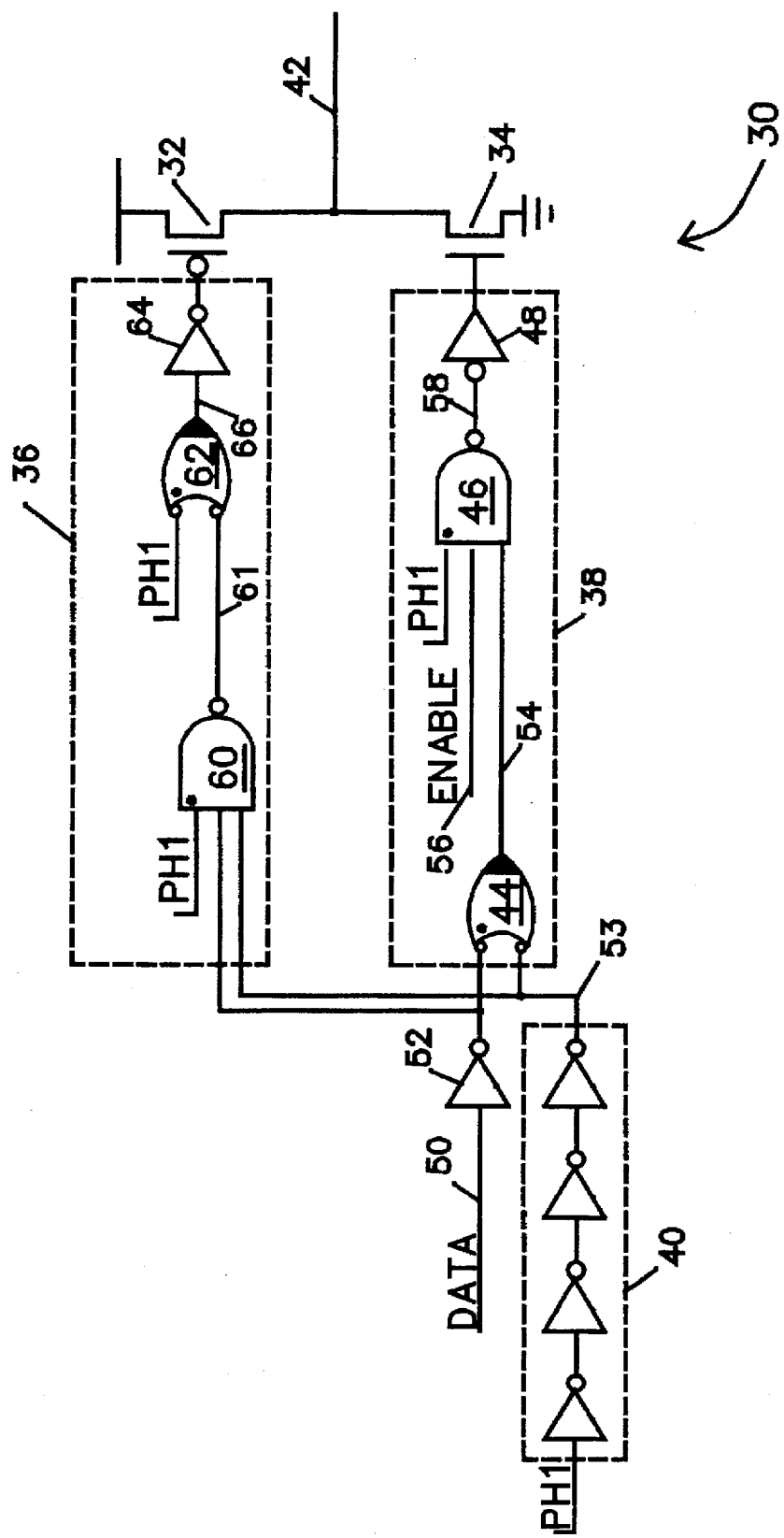
FIG. 6 is a circuit diagram of a driver circuit according to one embodiment of the present invention.

Turning now to FIG. 6, a circuit diagram of a driver circuit 30 in accordance with the present invention is shown. Driver circuit 30 includes transistors 32 and 34, as well as logic circuits 36 and 38 and delay circuit 40. Transistor 32 is coupled between a power supply and a bus conductor 42, while transistor 34 is coupled between bus conductor 42 and a ground. Bus conductor 42 may be configured near other bus conductors driven by similar driver circuits in order to form a bus. As shown in FIG. 6, transistor 32 is a PMOS transistor and transistor 34 is an NMOS transistor.

Logic circuits 36 and 38 activate transistors 32 and 34 in order to provide the unconditional discharge of bus conductor 42 during the first drive phase, as well as to provide the recharge or continued discharge of bus conductor 42 during the second drive phase. The first and second drive phases and the precharge drive state are defined by the clock signal PH1 shown in FIG. 6 in conjunction with a delayed clock signal produced by delay circuit 40. In the embodiment shown, delay circuit 40 includes a plurality of inverter circuits coupled in series. An even number of inverter circuits are included, such that the delayed clock signal is in phase with the PH1 clock signal (i.e. the delay between the rising edges of the clock signal and the delayed clock signal is equal to the propagation delay of delay circuit 40). If an odd number of inverter circuits were used, the delayed clock signal would be out of phase with the PH1 clock signal (i.e. the delay between rising edges of the clock signal and the delayed clock signal is equal to the propagation delay of delay circuit 40 plus one half of the period of the clock signal).

Transistor 32 is provided to charge bus conductor 42. Transistor 32 is activated by logic circuit 36 during the precharge drive state in order to precharge bus conductor 42 to the voltage provided by the power supply. Additionally, transistor 32 is activated by logic circuit 36 during the second drive phase of the logic drive state if bus conductor 42 is conveying a high voltage in the current clock cycle. It is noted that a clock cycle is a time period defined by the clocking signal (or clock signal) provided to the integrated circuit upon which the driver circuit is configured.

Transistor 34 is provided to discharge bus conductor 42. Logic circuit 38 activates transistor 34 during the first drive phase of the logic drive state, regardless of whether or not bus conductor 42 is conveying a low voltage in the current clock cycle. Additionally, logic circuit 38 activates transistor 34 during the second drive phase of the logic drive state if bus conductor 42 is conveying a low voltage during the current clock cycle.

In one embodiment, logic circuit 38 includes invert-or gate 44, nand gate 46, and invert-buffer 48. Invert-or gate 44 receives an inversion of the data value to be conveyed upon bus conductor 42. The data value is provided upon a data conductor 50 to inverter 52, which is coupled to invert-or gate 44. Invert-or gate 44 further receives the delayed clock signal upon a conductor 53. The output signal of invert-or gate 44 is conveyed upon a conductor 54 to nand gate 46. Additionally, nand gate 46 receives an enable signal upon a conductor 56 as well as the clock signal PH1. The enable signal is indicative, when asserted, that driver circuit 30 is to drive the data value onto bus conductor 42 during the clock cycle. The output of nand gate 46 is conveyed upon a conductor 58 to inverter-buffer 48, which is in turn coupled to the gate terminal of transistor 34.

Transistor 34 is activated by a high voltage upon its gate terminal, and therefore by a low voltage upon conductor 58. Nand gate 46 produces a low voltage upon conductor 58 if each of its inputs is a logical one. Therefore, transistor 34 is activated during times in which the PH1 clock signal is high, the enable signal is asserted and either the data signal upon data conductor 50 is a logical one or the delayed clock signal upon conductor 53 is low. It can be seen that if driver circuit 30 is enabled, then bus conductor 42 is discharged during times when the PH1 clock signal is high and the delayed clock signal is low. The first drive phase is thereby defined to be the time interval when the PH1 clock signal is high and the delayed clock signal is low for this embodiment. In other words, the first drive phase is the time interval equal to the delay produced by delay circuit 40. Furthermore, if the enable signal is asserted and the data signal is a logical one, then transistor 34 is activated while the PH1 clock signal is high. Therefore, bus conductor 42 is discharged when conveying a logical one data value. Driver circuit 30 as shown in FIG. 6 is an inverting driver circuit which produces a low voltage on bus conductor 42 when a logical one is conveyed and a high voltage on bus conductor 42 when a logical zero is conveyed. Non-inverting embodiments of driver circuit 30 are contemplated as well.

In one embodiment, logic circuit 36 includes nand gate 60, invert-or gate 62, and inverter 64. The connection of the PH1 clock signal to invert-or gate 62 produces a logical one upon a conductor 66 coupled between invert-or gate 62 and inverter 64 when the PH1 clock signal is low. The logical one at the input of inverter 64 produces a low voltage upon the gate terminal of transistor 32, activating the transistor. The time interval in which the PH1 clock signal is low thereby defines the precharge drive state. A logical one upon conductor 66 is additionally generated if nand gate 60 provides a logical zero upon conductor 61. Nand gate 60 produces a logical zero if all of its inputs are logical ones. Therefore, a logical zero is transmitted upon conductor 61 if the PH1 clock signal is high, the data value upon data conductor 50 is low, and the delayed clock signal is high. The second drive phase is therefore defined for this embodiment as the time period when both the PH1 clock signal and the delayed clock signal are high.

The embodiment of driver circuit 30 shown in FIG. 6 is suitable for connection upon a bus including one or more receivers but no other drivers. An embodiment for use with multiple drivers includes an enable signal input into nand gate 60, such that the recharge of bus conductor 42 during the second drive phase occurs only if driver circuit 30 is enabled. Driver circuit 30 thereby remains inactive when not enabled, such that another driver circuit coupled to bus conductor 42 may control the voltage upon conductor 42.

It is noted that transistor 32 provides charging functions which are less critical to the propagation delay of the dynamic bus than the discharging function of transistor 34. Transistor 32 may therefore be configured with a lower current capability than transistor 34. It is further noted that a circuit similar to driver circuit 30 is contemplated for a dynamic bus which precharges conductors to a ground voltage and drives appropriate conductors to a high voltage during the logic drive state.

Figure 7:
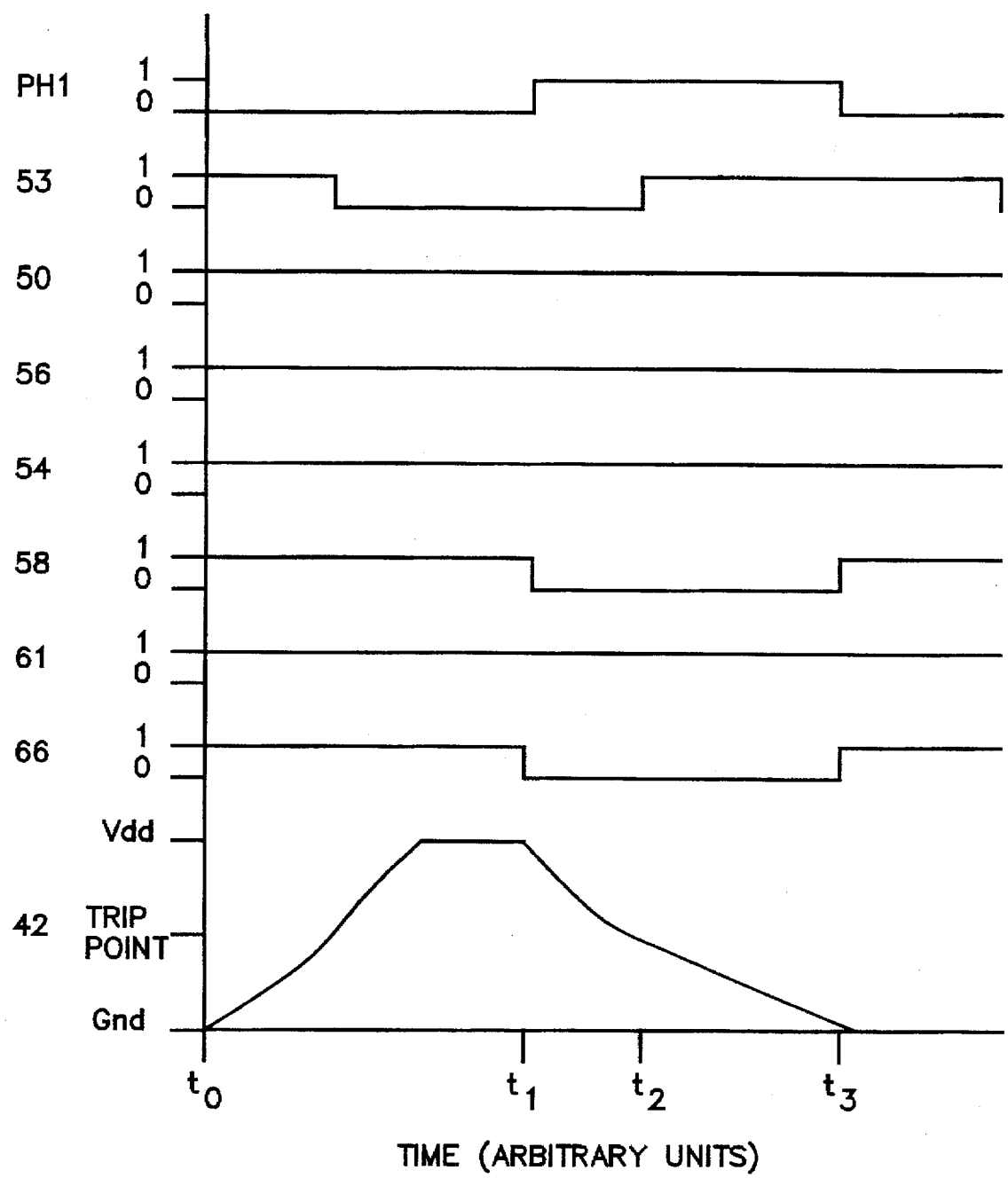
FIG. 7 is a timing diagram showing signals upon conductors of the circuit diagram shown in FIG. 6 for the case in which the output node of the driver circuit is discharged during a drive phase.
Figure 8:
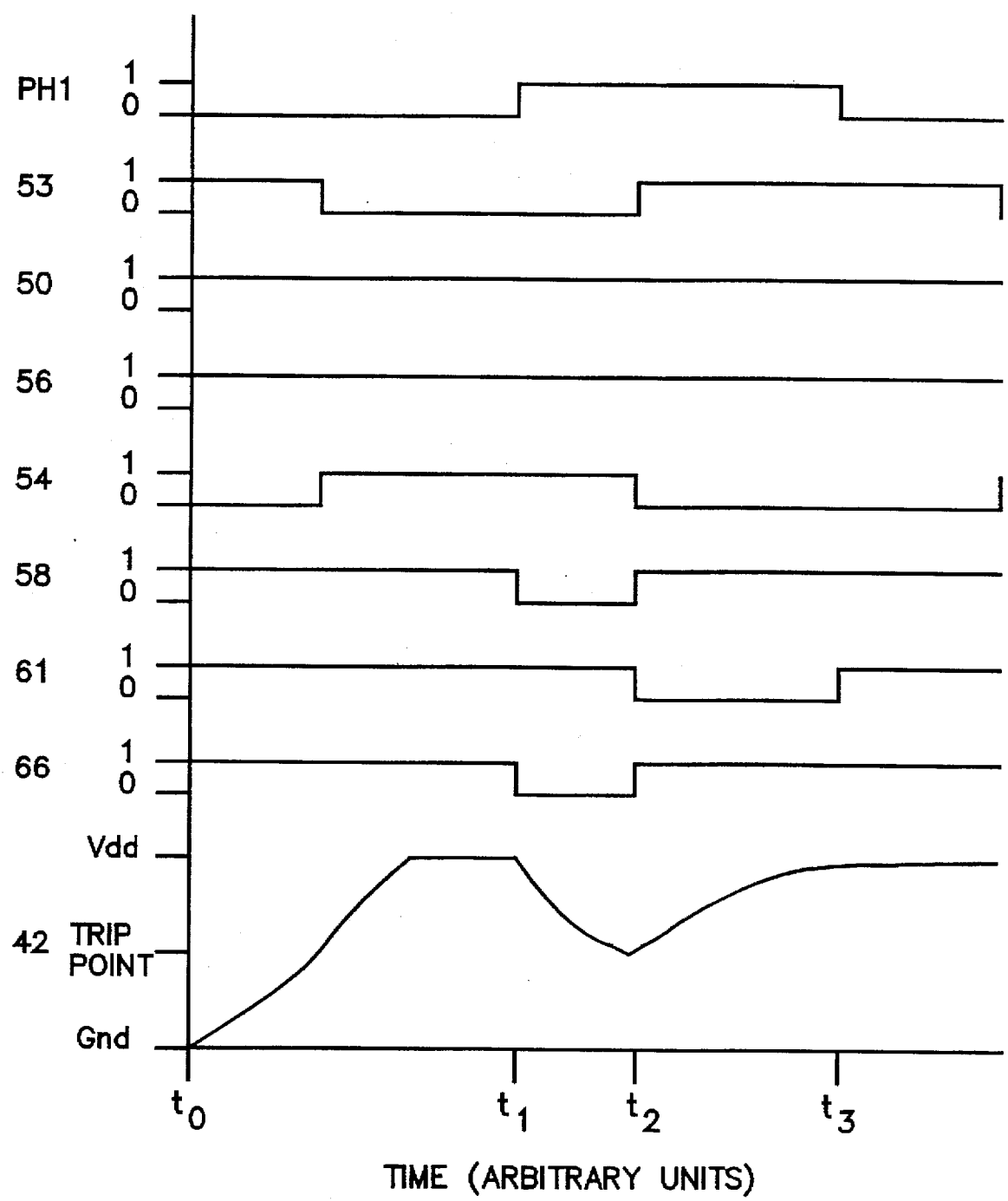
FIG. 8 is a timing diagram showing signals upon conductors of the circuit diagram shown in FIG. 6 for the case in which the output node of the driver circuit is not discharged during the drive phase.

The operation of driver circuit 30 may be further illustrated through reference to FIGS. 7 and 8. FIGS. 7 and 8 depict timing diagrams of signals within driver circuit 30. FIG. 7 depicts the case in which bus conductor 42 is conveying a low voltage during the current clock cycle. FIG. 8 depicts the case in which bus conductor 42 is conveying a high voltage during the current clock cycle. Each of the wave forms shown on the timing diagram is labeled with a reference number. The reference number identifies which of the conductors within driver circuit 30 is associated with the waveform. Additionally, "PH1" represents the PH1 clock signal shown in several locations within FIG. 6. For simplicity, signals other than the signal upon bus conductor 42 are shown as transitioning instantly from low to high values. Additionally, the values for signals other than the signal upon bus conductor 42 are shown as logical zero and logical one. In one embodiment, a logical zero corresponds to a low voltage and a logical one corresponds to a high voltage.

Along the horizontal (time) axis of the timing diagrams shown in FIGS. 7 and 8, several times are noted ($t_0$ through $t_3$). The time interval defined by $t_0$ and $t_1$ is the precharge drive state. The time interval defined by $t_1$ and $t_2$ is the first drive phase. Similarly, the time interval defined by $t_2$ and $t_3$ is the second drive phase. The time interval defined by $t_0$ and $t_3$ comprises a clock cycle.

Referring to FIG. 7, the data value upon conductor 50 is a logical one, indicating that bus conductor 42 is to be discharged during the current clock cycle. During the precharge drive state, bus conductor 42 is precharged to the high voltage level. During the first drive phase, conductor 58 transitions to a logical zero in response to the logical one upon PH1 and conductors 54 and 56. Transistor 34 is activated, discharging bus conductor 32 during both the first and second drive phases. Transistor 32 remains deactivated during the first and second drive phases, due to the logical zero upon conductor 66 in response to the logical one upon conductor 61, which is further in response to the logical one upon conductor 50. Therefore, conductor 42 is discharged fully to the ground voltage.

It is noted that the rate of discharge of bus conductor 42 slows during the second drive phase. This rate change is due to the charging of bus conductors coupled near conductor 42. If no bus conductors coupled near conductor 42 begin charging, then the rate of discharge during the second drive phase may be substantially similar to the rate of discharge during the first drive phase.

Referring to FIG. 8, the data value upon conductor 50 is a logical zero, indicating that bus conductor 42 is to remain charged during the current clock cycle. Similar to FIG. 7, bus conductor 42 is precharged during the precharge drive state and discharges during the first drive phase. However, upon entering the second drive phase at time $t_2$, transistor 32 is activated in response to conductor 66 conveying a logical one. Conductor 66 receives a logical one in response to conductor 61 conveying a logical zero, which is further in response to the delayed clock signal transitioning high. In addition, transistor 34 is deactivated during the second drive phase in response to conductor 58 conveying a logical one. Conductor 58 receives a logical one in response to conductor 54 conveying a logical zero, which is further in response to the delay clock signal transitioning high.

It is noted that the enable signal and data value are shown for simplicity as stable values within FIGS. 7 and 8. However, the data and enable signals may transition during the precharge drive state.

Figure 9:
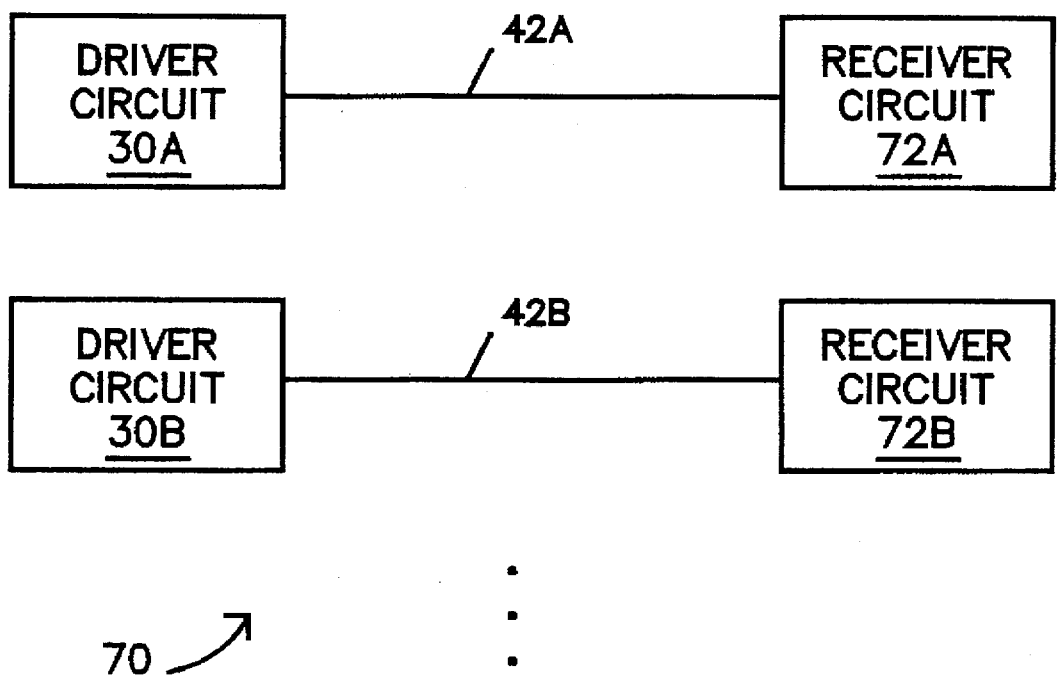
FIG. 9 is a block diagram of drivers and receivers upon an exemplary bus.

Turning now to FIG. 9, an exemplary bus 70 is shown. Bus 70 includes a plurality of bus conductors 42A, 42B, etc. Bus conductors 42 are coupled between a plurality of driver circuits 30A, 30B, etc., and a plurality of receiver circuits 72A, 72B, etc. Driver circuits 30 both precharge and drive conductors 42 during respective precharge and drive states. Receiver circuits 72 receive the values driven upon respective conductors 42. Logic circuits coupled to receiver circuits 72 may then process the received value.

It is noted that the above discussion often refers to signal being asserted or deasserted. As used herein, a signal is asserted if its value is indicative of a particular condition (e.g. enablement of driver circuit 30). Conversely, a signal is deasserted if its value is not indicative of a particular condition. A signal may be defined to be asserted when it conveys a logical zero, or when it conveys a logical one.

It will be appreciated to those skilled in the art having the benefit of this disclosure that this invention is believed to be capable of operating within any bus having a plurality of conductors. The driver circuit and method hereof advantageously discharges to the trip point of a receiver more quickly than was previously achievable due to the unconditional discharge of each conductor within the bus. Once the trip point is reached, the conductors which are to remain charged during the current clock cycle are recharged to the high voltage, while the remaining conductors are discharged to ground. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A driver circuit, comprising:
   a first transistor coupled between a ground and a conductor;
   a second transistor coupled between a power supply and said conductor;
   a first logic circuit coupled to a gate terminal of said first transistor, said first logic circuit further coupled to receive a first signal, wherein said first logic circuit is configured to activate said first transistor during a first drive phase of a logic drive state if said first signal is asserted; and
   a second logic circuit coupled to a gate terminal of said second transistor, said second logic circuit further coupled to receive a second signal, wherein said second logic circuit is configured to activate said second transistor during a second drive phase of said logic drive state if said second signal is deasserted.

2. The driver circuit as recited in claim 1 wherein said first transistor comprises an NMOS transistor.

3. The driver circuit as recited in claim 1 wherein said second transistor comprises a PMOS transistor.

4. The driver circuit as recited in claim 1 wherein said first logic circuit and said second logic circuit are coupled to receive a clock signal and a delayed clock signal, and wherein said clock signal and said delayed clock signal define said first drive phase and said second drive phase.

5. The driver circuit as recited in claim 4 wherein said first drive phase comprises a time interval during which said clock signal is asserted and said delayed clock signal is deasserted.

6. The driver circuit as recited in claim 4 wherein said second drive phase comprises a time interval during which said clock signal is asserted and said delayed clock signal is asserted.

7. The driver circuit as recited in claim 4 further comprising a delay circuit coupled to receive said clock signal, wherein said delay circuit is configured to provide said delayed clock signal.

8. The driver circuit as recited in claim 7 wherein said delay circuit comprises a plurality of inverter circuits coupled in series.

9. The driver circuit as recited in claim 8 wherein said plurality of inverter circuits are even in number.

10. The driver circuit as recited in claim 4 wherein said second logic circuit is configured to activate said second transistor during a precharge drive state.

11. The driver circuit as recited in claim 10 wherein said precharge drive state is defined by said clock signal.

12. The driver circuit as recited in claim 11 wherein said precharge drive state comprises a time interval during which said clock signal is deasserted.

13. The driver circuit as recited in claim 1 wherein said first signal is indicative, when asserted, that the driver circuit is enabled to drive said conductor.

14. The driver circuit as recited in claim 13 wherein said second signal is indicative of a value to be driven upon said conductor if the driver circuit is enabled.

15. A bus, comprising:
   a plurality of conductors configured within said bus; and a plurality of driver circuits, wherein each of said plurality of driver circuits are coupled to a respective one of said plurality of conductors, said each of said plurality of driver circuits comprising:
- a first transistor and logic circuit configured to discharge said respective one of said plurality of conductors during a first drive phase of a logic drive state; and
- a second transistor and logic circuit configured to selectably charge said respective one of said plurality of conductors during a second drive phase of said logic drive state.

16. The bus as recited in claim 15 wherein said second transistor and logic circuit are configured to selectably charge said respective one of said plurality of conductors in response to a signal indicative of a value to be conveyed upon said respective one of said plurality of conductors.

17. The bus as recited in claim 16 wherein said second transistor and logic circuit are configured to charge said respective one of said plurality of conductors if said signal is deasserted.

18. The bus as recited in claim 16 further comprising a plurality of receiver circuits, wherein each of said plurality of receiver circuits is coupled to said respective one of said plurality of conductors, and wherein said plurality of receiver circuits are configured to receive said value conveyed upon said bus.

19. A method for operating a bus to reduce line to line coupling, comprising:

presetting each of a plurality of conductors configured into said bus to an initial value during a first drive state;

driving each of said plurality of conductors toward a second value different from said initial value during a first drive phase of a logic drive state;

driving a first portion of said plurality of conductors to said initial value during a second drive phase of said logic drive state; and driving a second portion of said plurality of conductors to said second value during said second drive phase of said logic drive state.

20. The method as recited in claim 19 wherein said first drive state comprises a precharge drive state, and wherein said initial value comprises a precharge value.

* * * * *